United States Patent [19]

Sato

[11] 4,282,603
[45] Aug. 4, 1981

[54] SYNTHESIZER TUNER
[75] Inventor: Tetsuo Sato, Fussa, Japan
[73] Assignee: Hitachi, Ltd., Tokyo, Japan
[21] Appl. No.: 56,851
[22] Filed: Jul. 12, 1979
[30] Foreign Application Priority Data
  Jul. 24, 1978 [JP] Japan ................................. 53-89456
[51] Int. Cl.³ .......................... H04B 1/26; H03L 7/18
[52] U.S. Cl. .................................. 455/183; 455/184; 455/186
[58] Field of Search ................. 455/165, 179, 183–186

[56] References Cited
U.S. PATENT DOCUMENTS

| | | | |
|---|---|---|---|
| 3,990,027 | 11/1976 | Kawashima | 455/186 |
| 4,110,694 | 10/1978 | Wilhelm | 455/183 |
| 4,138,647 | 2/1979 | Wine | 455/186 |

Primary Examiner—Marc E. Bookbinder
Attorney, Agent, or Firm—Craig and Antonelli

[57] ABSTRACT

A selecting information for adjusting the frequency-dividing ratio of a programable divider in a PLL synthesizer tuner is stored in the memory.

In order to prevent the same selecting information from being written down in the different addresses in the memory, all of the selecting informations already written down in the memory is compared with the selecting information that is to be written down by a comparator circuit before the selecting information is written down in the memory. The output of the comparator circuit permis the selecting information to be written into the new addresses only when the selecting information that is to be written down is different from all of the selecting informations which have been written down already.

2 Claims, 4 Drawing Figures

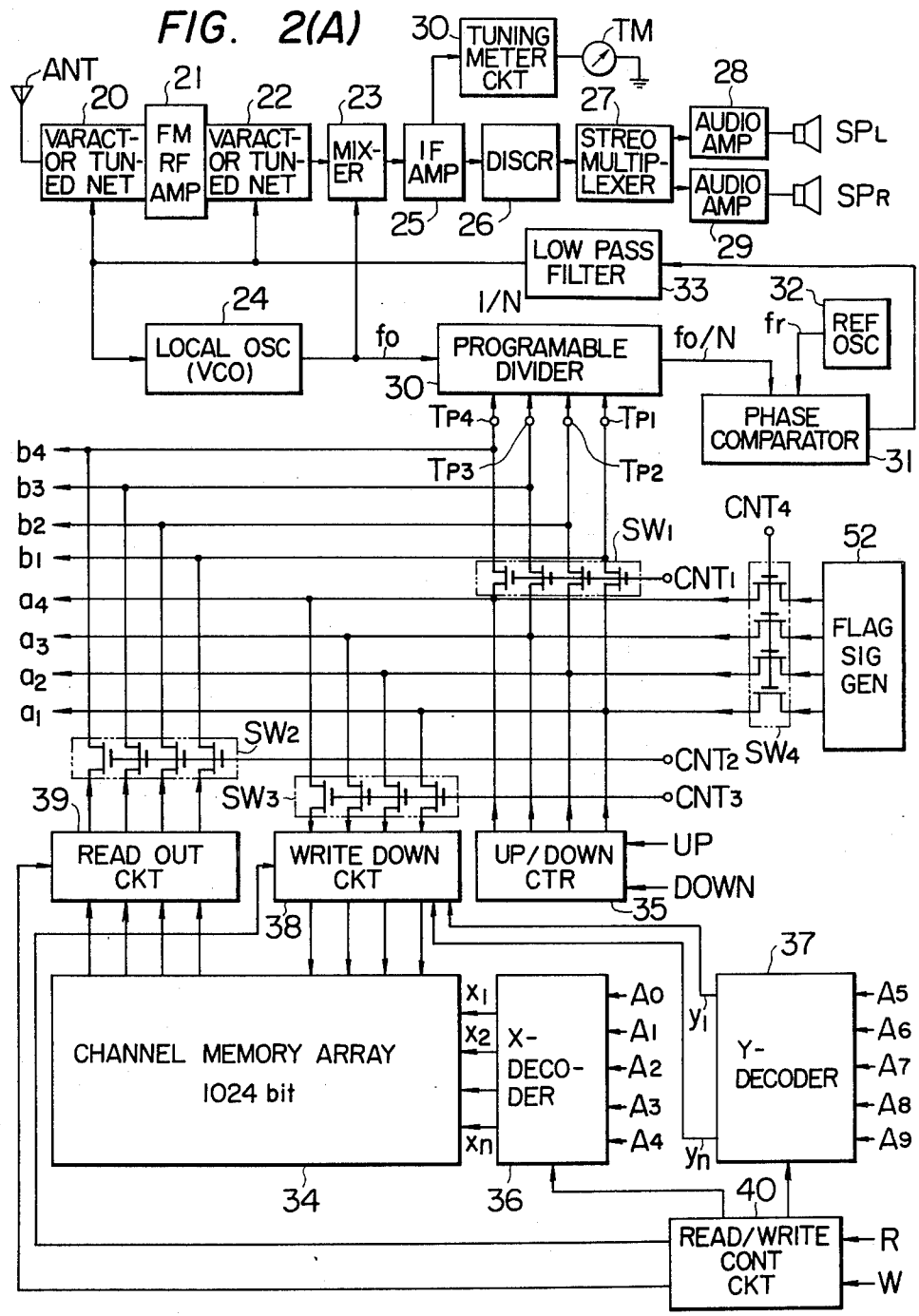

SYNTHESIZER TUNER

BACKGROUND OF THE INVENTION

The present invention relates to a synthesizer tuner.

A synthesizer tuner has been widely known as disclosed, for example, in IEEE TRANSACTIONS ON BROADCAST AND TELEVISION RECEIVERS, Vol. BTR-15, No. 3, pp. 235-243, issued in October, 1969. According to the conventional synthesizer tuners, a PLL (phase locked loop) synthesizer is used as a local oscillator to obtain a plurality of local oscillation frequencies separated a predetermined frequency gap. Output signals of a phase comparator in the PLL circuit are applied via a low-pass filter to a varactor diode in a main antenna tuner circuit and to a varactor diode in an interstage tuner circuit between an RF (radio frequency) amplifier and a mixer. Therefore, the difference between a local oscillation frequency and a frequency of received signals can be reduced to a virtually negligible value.

The PLL circuit employed in the coventional synthesizer tuner consists of a programable divider, a reference frequency generator, a phase comparator, a low-pass filter and a voltage controlled oscillator. The voltage controlled oscillator is used as a local oscillator. Upon reception of a predetermined binary signal through a preset terminal, the programable divider produces a frequency-divided signal obtained by dividing the frequency of an output signal of the voltage controlled oscillator by a predetermined dividing ratio. The frequency-divided signal and a reference frequency signal of the reference frequency generator are applied to the phase comparator, and an output signal of the phase comparator is applied via a low-pass filter to the varactor diode in the abovementioned tuner circuit as well as to the voltage controlled oscillator. The output signals of the voltage controlled oscillator that works as a local oscillating circuit are applied to a mixer.

A method of setting the received signal frequencies has also been widely known as disclosed, for example, in Japanese Patent Application Laid-Open Specification No. 52-144211, by providing a channel memory in the synthesizer tuner, storing predetermined binary signals into the channel memory by manipulating a key board, and supplying the stored binary signals into a preset terminal of the programable divider.

In developing a synthesizing tuner in which a plurality of informations for selecting broadcasting stations (i.e., a plurality groups of binary signals) are successively written into a plurality of addresses in the channel memory by operating the key board, to successively read out the plurality of informations for selecting broadcasting stations by successively operating readout keys of the key board, the inventor of the present invention has found that the same information for selecting broadcasting stations is written two or more times into different addresses, causing the utilization factor of the memory to be decreased. Particularly, when the tuner is used by a plurality of people with the channel memory being composed of a nonvolatile memory, the individual person may individually write information in the memory presenting increased probability of writing information in an overlapped manner.

SUMMARY OF THE INVENTION

The object of the present invention is to provide a frequency synthesizer tuner which is capable of preventing the same selecting information from being written down in an overlapped manner in the channel memory.

In order to achieve the abovementioned object, the present invention is provided with means which, before the information is being written in the channel memory, compares the contents which have already been written down with the information being written, such that the overlapped writing is prevented by the output of the comparator.

DESCRIPTION OF THE PREFERRED EMBODIMENTS

The present invention is concretely mentioned below by way of an embodiment.

Figure 1:
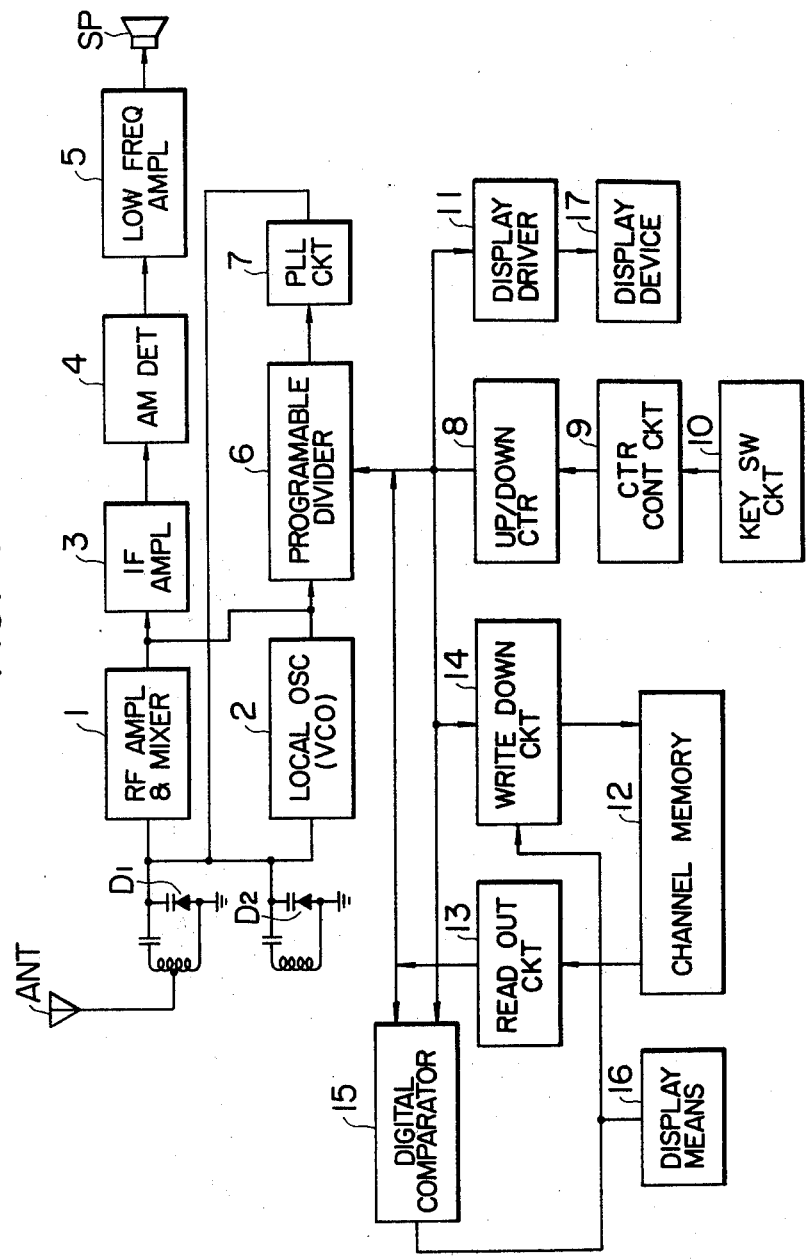
FIG. 1 is a block diagram showing a basic setup of an AM synthesizer tuner according to an embodiment of the present invention.

FIG. 1 is a block diagram of an AM synthesizer tuner according in principle to an embodiment of the present invention, in which reference numeral 1 represents an RF amplifier and mixer. The output of the RF amplifier and mixer is applied to an intermediate-frequency amplifier circuit 3, demodulated through an AM detector circuit 4, and is amplified by a low-frequency amplifier circuit 5 to drive a speaker SP.

A variable capacitance diode at the front end in a prestage of the RF amplifier and mixer is controlled by the PLL (phase locked loop) circuit to select a predetermined broadcasting station.

That is, a voltage controlled oscillating circuit is used as a local oscillating circuit 2, and its output is applied to a programmable divider 6, and a signal of which the frequency is divided into one-Nth depending upon the information of the selected broadcasting station applied to the preset terminal, is applied to the PLL circuit 7.

The PLL circuit compares the frequency-divided output with a reference frequency oscillating output in regard to the phase. The output of the PLL circuit is converted into a d-c voltage through a low-pass filter to control the variable capacitance diodes $D_1$, $D_2$ and the local oscillating circuit 2. This enables the local oscillating frequency to be locked such that the reference frequency comes into agreement with the local oscillating output of which the frequency has been divided into one-Nth.

In other words, if the reference frequency of the PLL circuit is denoted by fr, the local oscillating frequency fo is equal to N·fr. By suitably selecting the frequency-dividing ratio N of the programable divider 6, it becomes possible to receive the radio waves from a desired broadcasting station.

The programable divider 6 can obtain any frequency-dividing ratios depending upon binary information applied to a program terminal which serves as the preset terminal. The binary information is formed by an up/down counter 8.

The up/down counter 8 performs the count-up or countdown operation for binary signals responsive to a control signal produced by a key switch circuit 10 and a counter control circuit 9, thereby to specify a desired frequency by sequentially changing the frequency-dividing ratio.

Reference numeral 11 represents a display driver which upon reception of the abovementioned programmed input information, drives the display to digitally display the frequency of the received signals.

Reference numeral 12 represents a channel memory circuit. By manipulating the key switches corresponding to the memory addresses, the selecting information of a frequency-dividing ratio corresponding to the receiving station can be written down in the addresses of the channel memory circuit via a writing-down circuit 14. In case of memory selection by the key switches, the information read by the read-out circuit 13 is fed to the programable divider 6 faster than the output of the up/down counter. In effect, the broadcasting station is selected irrespective of the output of the up/down counter.

In the tuner according to the embodiment of the present invention having such a memory function, the read-out circuit 13 and the writing-down circuit 14 are provided with functions that will be mentioned later, and with a digital comparator 15 and a display means 16, in order that the same selection information can be prevented from being written down in an overlapped manner in different addresses.

Before the received station manually selected by the output of the up/down counter 8 is written on the memory, the read-out circuit 13 will be operated by the key signals to successively read out the stored contents. The thus read-out information and the information that is to be written which is the output of the up/down counter, are judged by the digital comparator 15 in regard to whether they are in agreement or not. When they are not in agreement, the memory addresses are changed to repeat the same operation. When the information has not been written in all memories, the writing-down circuit 14 is caused to operate for the first time, thereby to effect the writing-down.

When a coincidence output is produced during the abovementioned comparing operation, on the other hand, the coincidence is displayed by means of the display means 16.

Therefore, before the information is written down in the memory, the information of the same station is prevented from being written down in the different addresses in the overlapped manner because the information-search of the contents of information which has been already written is carried out. Consequently, the memory can be effectively utilized.

The present invention shall by no means be limited to the abovementioned embodiment only, but can be extensively used for the frequency synthesizer tuners having memory functions. Particularly, the invention can be easily put into practice by changing the program of a microcomputer when the programable divider 6 is to be controlled by the microcomputer.

Figure 2B:
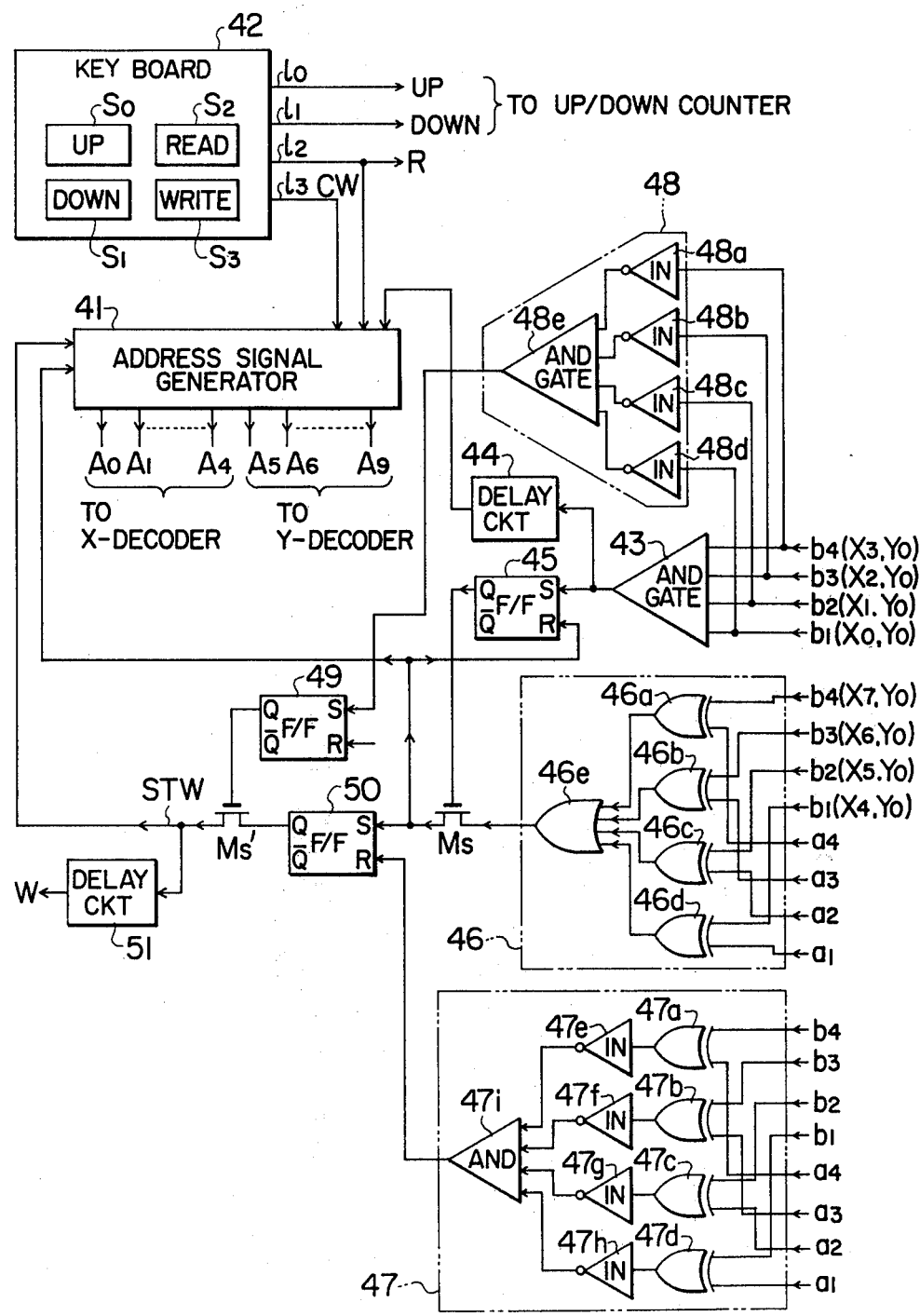
FIG. 2 (A) and FIG. 2 (B) are block diagrams of an FM stereophonic synthesizer tuner according to the embodiment of the present invention.

FIG. 2 (A) and FIG. 2 (B) are block diagrams of an embodiment in which the present invention is applied to an FM stereophonic synthesizer tuner. The RF signals received by an antenna ANT are applied to a main antenna tuner circuit 20, and are amplified through an RF amplifier 21. The output signals of the RF amplifier 21 are fed to a mixer 23 via an interstage tuner circuit 22. To the mixer 23 are further fed oscillating outputs of a local oscillating circuit 24. The IF signals obtained from the mixer are amplified through an IF amplifier circuit 25, and the output of the IF amplifier circuit 25 are fed to a frequency discriminator 26. The output of the frequency discriminator 26 is fed to a stereophonic multiplexer 27. The left-channel demodulated output signals obtained by the stereophonic multiplexer 27 are fed to a left-channel speaker $SP_L$ via an audio amplifier 28, and the right-channel demodulated output signals obtained by the stereophonic multiplexer 27 are fed to a right-channel speaker $SP_R$ via an audio amplifier 29.

The IF signals from the IF amplifier circuit 25 are also supplied to a tuning meter circuit 30 which drives a tuning meter TM. The oscillating output of the local oscillating circuit 24 is fed to a programmable divider 30, and is divided for their frequency into one-Nth. Any frequency-dividing ratios can be obtained by feeding predetermined binary signals to preset terminals $T_{p1}$ to $T_{p4}$ of a programable divider 30. The frequency-divided output of the programable divider 30 is fed to a phase comparator 31. To the phase comparator 31 is also fed a reference frequency signal produced by a reference frequency oscillator 32. The output of the phase comparator 31 is fed via a low-pass filter 33 to the local oscillating circuit 24 which is constructed in the form of a voltage controlled oscillator, and is also supplied to varactor diodes in the main antenna tuner circuit 20 and to varactor diodes in the interstage tuner circuit 22.

The above circuit blocks 24, 30 to 33 constitute a PLL circuit. Here, if the frequency of the reference frequency signal is denoted by fr, and the frequency-dividing ratio by N, the oscillating frequency $f_o$ of the local oscillating circuit 24 is locked to $f_o = N \cdot fr$.

A key board 42 has a plurality of key switches $S_0$ to $S_3$, and a key switch circuit for obtaining desired electric signals by operating the key switches. When the key switch $S_0$ is pushed, the key board 34 produces an up signal UP to the line $l_0$. Responsive to the up signal UP of a predetermined level, the up/down counter 35 executes the one-bit count up of a count content of 4 bits. As the key switch $S_0$ is pushed two times or three times, the up/down counter 35 executes the two-bit or three-bit count up.

When the key switch $S_1$ is pushed, the key board 42 produces a down signal DOWN to the line $l_1$. Responsive to the down signal DOWN of a predetermined level, the up/down counter 35 executes the one-bit count down of the count content of 4 bits. As the key switch $S_1$ is pushed two times or three times, the up/down counter 35 executes two-bit or three-bit count down.

Any binary signals obtained by the up/down counting of the up/down counter 35 are applied to the preset terminals $T_{p1}$ to $T_{p4}$ of the prgramable divider 30 via a first switching means $SW_1$ to obtain any desired frequency-dividing ratio. It is therefore made possible to obtain a local oscillating output of any frequency $f_o$ from the local oscillating circuit 24, such that the synthesizer tuner is eventually tuned to any RF frequency.

Whether the synthesizer tuner is tuned to the RF station or not can be detected by the deflection of an indicator needle of the tuning meter TM or by the sound reproduced from the speaker.

The channel memory 34 is composed of nonvolatile memories. The nonvolatile and electrically alterable read-only memory works based, for example, upon the hysteresis characteristics of threshold values of an MNOS (metal-nitride-oxide-silicon) transistor. The nonvolatile memory of this kind has been known, for example, in the journal IEEE International Solid-State Circuits Conference DIGEST OF TECHNICAL PAPERS, pp. 204-205 issued in 1974. The channel memory 34 will be able to store, for example, 1024 bits of information.

Around the periphery of the channel memory 34 have been disposed an X-decoder 36, a Y-decoder 37, a write-down circuit 38, a read-out circuit 39, and a write/read control circuit 40. X-Address signals $A_0$ to $A_4$ are fed to the X-decoder 36, and Y-address signals $A_5$ to $A_9$ are fed to the Y-decoder 37. Read-out control signals R and write-down control signals W of a predetermined level are fed to the write/read control circuit 40.

The channel memory 34 stores selecting information according to the below-mentioned steps.

Figure 3:
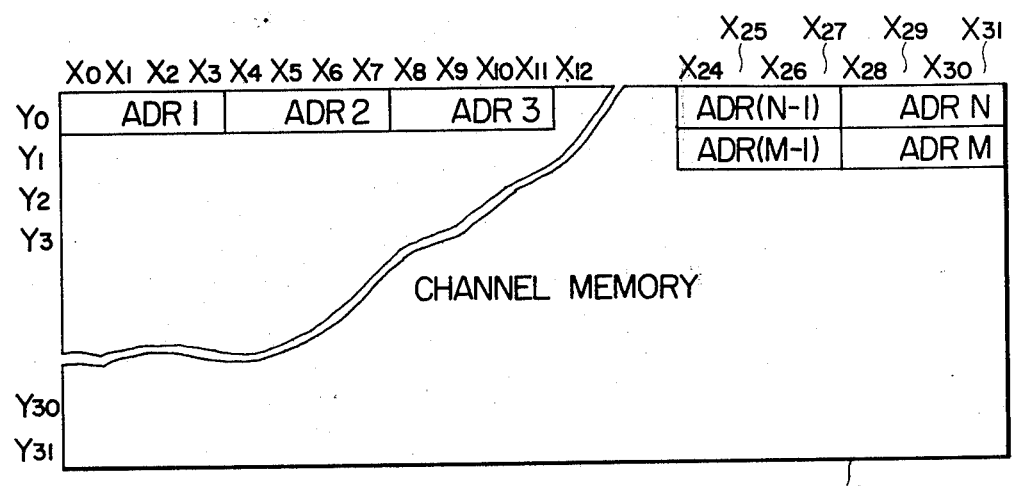
FIG. 3 shows a setup of addresses of nonvolatile memory used as a channel memory.

(1) The tuned state of the first FM radio station can be detected with reference to the deflection of the indicator needle of the tuning meter TM. As the key switch $S_3$ of the key board 42 is pushed to store the tuned state, the key board 42 produces a write-down command signal CW to the line $l_3$. Upon reception of the write-down command signal CW of a predetermined level, the address signal generator 41 produces X-address signals $A_0$ to $A_4$ and Y-address signals $A_5$ to $A_9$. In this case, the levels of the X-address signals and Y-address signals have been so set that the 4-bit flag addresses ADR1 $(X_0, Y_0)$, $(X_1, Y_0)$, $(X_2, Y_0)$ and $(X_3, Y_0)$ (refer to FIG. 3) of the channel memory 34 are selected. At this moment, a signal consisting of 4 bits of logic "1" is written down in the 4-bit flag address, and the X-address signals $A_0$ to $A_4$ and Y-address signals $A_5$ to $A_9$ produced by the address signal generator 41 are so changed in regard to their levels that the 4-bit data addresses ADR2 $(X_4, Y_0)$, $(X_5, Y_0)$, $(X_6, Y_0)$ and $(X_7, Y_0)$ of the channel memory 34 are selected. In the 4-bit data address ADR2 are stored 4-bit count signals of the up/down counter 35 necessary for attaining tuning to the first FM radio station.

(2) By continuously pushings the key switch $S_0$ of the key board 42, the up/down counter 35 continuously executes the count up each by one bit. When the counted content of the up/down counter 35 satisfies the state which is tuned to a second FM radio station which is different from the first FM radio station, the deflection of the needle of the tuning meter TM indicates the tuning of the synthesizer tuner.

When the key switch $S_3$ of the key board 42 is pushed to store the tuned state, the X-address signals $A_0$ to $A_4$ and Y-address signals $A_5$ to $A_9$ are generated such that the 4-bit flag addresses ADR1 $(X_0, Y_0)$ to $(X_3, Y_0)$ of the channel memory are selected by the write-down command signal CW which is sent onto the line $l_3$.

Since the signal consisting of 4 bits of logic "1" had been written down into the 4-bit flag addresses ADR1 $(X_0, Y_0)$ to $(X_3, Y_0)$ in the step (1) above, the output of an AND gate circuit 43 becomes a level of logic "1"; the signal of logic "1" is fed to an address signal generator 41 via a delay circuit 44. Then, the levels of the X-address signals $A_0$ to $A_4$ and Y-address signals $A_5$ to $A_9$ are so changed that the 4-bit data addresses ADR2 $(X_4, Y_0)$ to $(X_7, Y_0)$ of the channel memory 34 are selected.

On the other hand, the output of logic "1" of the AND gate circuit 43 is fed to a set terminal S of a flip-flop circuit 45, whereby its output Q causes a switching transistor Ms to be conductive.

As the 4-bit data addresses ADR2 $(X_4, Y_0)$ to $(X_7, Y_0)$ of the channel memory 34 are selected, the 4-bit counted contents (counted content when tuned to the first FM radio station) of the up/down counter 35 written down in the above step (1) are sent into the lines $b_1 \sim b_4$ via the read-out circuit 39 and a switch $SW_2$.

On the other hand, since the 4-bit counted contents of the up/down counter 35 which tuned to the second FM radio station have been sent to the lines $a_1$ to $a_4$, the first digital comparator 46 compares the logic levels of these lines, i.e., $b_4$ vs. $a_4$, $b_3$ vs. $a_3$, $b_2$ vs. $a_2$, and $b_1$ vs. $a_1$. The first digital comparator 46 consists of exclusive OR circuits 46a to 46d, and an OR circuit 46e which produces an output of logic "1", provided if there is any difference in logic level in the groups of lines $b_4$ and $a_4$, lines $b_3$ and $a_3$, lines $b_2$ and $a_2$, and lines $b_1$ and $a_1$. When the logic levels are all in agreement between each group of lines $b_4$ and $a_4$, lines $b_3$ and $a_3$, lines $b_2$ and $a_2$, and lines $a_1$ and $b_1$, the output of the OR circuit 46e becomes the logic "0".

Therefore, when the counted contents of the up/down counter 35 which tuned to the first FM radio station and to the second FM radio station, are not the same, the output of the OR circuit 46e in the first digital comparator 46 becomes the logic level "1" which will be fed to a reset terminal R of a flip-flop circuit 45 via the switching transistor Ms which has been rendered conductive, so that the flip-flop circuit 45 is reset. The output signal is further fed to the address signal generator 41. The address signal generator 41 then produces the X-address signals $A_0$ to $A_4$ and Y-address signals $A_5$ to $A_9$ of such a level as to select the next 4-bit flag address ADR3 $(X_8, Y_0)$ to $(X_{11}, Y_0)$ of the channel memory 34. Since no signal consisting of 4 bits of logic "1" has been written down in the 4-bit flag address ADR3, the lines $b_4$ to $b_1$ all become the logic "0". Therefore, the output Q of the AND gate circuit 43 becomes the logic level "0", and the switching transistor Ms is rendered nonconductive. In this case, the output of an empty detector circuit 48 composed of inverters 48a to 48d and an AND gate circuit 48e becomes the logic level "1" and is applied to a set terminal S of a flip-flop circuit 49. Therefore, the output Q of the flip-flop circuit 49 becomes the logic level "1".

Upon reception of the output of logic "1" of a digital comparator 46 at a set terminal S, a flip-flop circuit 50 connected to the switching transistor Ms produces an output Q of the logic "1". Therefore, the output signal of the logic level "1" of the flip-flop 50 is obtained as a write-down starting signal STW through a switching transistor Ms' which has been rendered conductive because the output Q of the logic level "1" of the flip-flop circuit 49 controlled by the empty detector circuit 48 has been applied to the gate.

As the write-down starting signal STW is applied to the address signal generator 41, there are produced X-address signals $A_0$ to $A_4$ and Y-address signals $A_5$ to $A_9$ of such a level that selects the 4-bit data addresses ADR4 $(X_{12}, Y_0)$ to $(X_{15}, Y_0)$ of the channel memory 34. As the write-down starting signal STW is fed to the delay circuit 51, the X-address signals and Y-address signals are generated and, thereafter, a write-down signal W is produced.

Upon recept of the write-down signal W, the write/read control circuit 40 actuates the write-down circuit 38, such that the 4-bit counted contents of the up/down counter 35 are written down into new 4-bit data addresses ADR4 $(X_{12}, Y_0)$ to $(X_{15}, Y_0)$ of the channel memory 34.

On the other hand, a second digital comparator 47 consisting of exclusive OR circuits 47a to 47d, inverters 47e to 47h and an AND gate circuit 47i, produces an output signal of the logic level "1" when the logic levels are in agreement in each of the groups of lines $b_4$ and $a_4$, lines $b_3$ and $a_3$, lines $b_2$ and $a_2$, and lines $b_1$ and $a_1$, or in other words, when the counted contents of the up/-down counter 35 which have already been stored in the channel memory 34 are in agreement with the counted contents which are newly stored in the up/down counter 35. The output signal of the logic level "1" is fed to the reset terminal R of the flip-flop circuit 50, whereby the output Q of the flip-flop circuit 50 becomes the logic level "0", and the write-down signal W of the logic level "1" is not produced by the delay circuit 51.

As mentioned above, when the 4-bit counted contents of the digital comparator 35 have already been stored in the 4-bit data addresses ADR2, ADR4, —ADRN, signals consisting of 4 bits of the logic level "1" have been stored in the corresponding 4-bit flag addresses ADR1, ADR2, —ADR (N−1). When the 4-bit counted contents of the digital comparator 35 have not yet been stored in the 4-bit data addresses ADRM, signals consisting of 4 bits of the logic level "0" are stored in the corresponding 4-bit flag address ADR (M−1).

In short, the counted contents of the up/down counter 35 on the lines $a_1$ to $a_4$ that are to be newly stored, are compared with a plurality of counted contents of the up/down counter 35 on the lines $b_1$ to $b_4$ which have already been stored in the channel memory 34 according to the below-mentioned steps.

(a) The AND gate circuit 46 detects the logic levels of the 4-bit flag addresses ADR1, ADR3, —ADR (N−1) to examine whether the counted contents of the up/down counter 35 have already been stored in the corresponding 4-bit data addresses ADR2, ADR4, —ADRN.

(b) When the above counted contents have already been stored in the 4-bit data addresses, the switching transistor Ms connected to the output of the first digital comparator 46 is maintained in the conductive state.

(c) The counted contents stored in the corresponding 4-bit data addresses are read out by the address signal generator 41, and the nonconformity between the thus read-out counted contents and the counted contents that are to be newly stored is detected by the first digital comparator 46.

When the counted contents stored in the 4-bit data addresses ADR2, ADR4, —ADRN, and the counted contents that are to be newly stored are all out of agreement, there is produced a write-down signal W of the logic level "1", whereby the counted contents that are to be newly stored are written down into a new 4-bit data address ADR (N+2) of the channel memory.

Prior to this, a flag signal of the logic level "1" from a flag signal generator 52 is written down into a corresponding 4-bit flag address ADR (N+1).

(c') The conformity between any one of the counted contents which have been already stored in the 4-bit data addresses ADR2, ADR4, —ADRN, and the counted contents that are to be stored, is detected by the second digital comparator 47. This causes the flip-flop circuit 50 to be reset, whereby no write-down signal W of the logic level "1" is produced. Thus, when the counted contents are in agreement, the counted contents to be stored are not written down into the new 4-bit data addresses of the channel memory.

When the key switch $S_2$ of the key board 42 is to be successively pushed, on the other hand, the selecting information is successively read out from the 4-bit data addresses ADR2, ADR4, —ADRN of the channel memory 34 via the read-out circuit 39. In this case, the switch $SW_1$ is rendered nonconductive and the switch $SW_2$ conductive.

Consequently, the selecting information read out from the read-out circuit 39 is fed to the preset terminals $T_{p1}$ to $T_{p4}$ of the programable divider 30 in preference to the output of the up/down counter 35.

What is claimed is:

1. A synthesizer tuner, comprising:

a radio-frequency amplifier and mixer;

A PLL circuit consisting of a voltage controlled oscillator which works as a local oscillating circuit, a programmable divider the input of which is supplied with the oscillating output signal of said voltage controlled oscillator, a reference frequency oscillator, a phase detector a first and the second input of which are supplied with a output signal of said programmable divider and the output signal of said reference frequency oscillator and a low-pass filter connected between an output of said phase detector and said voltage controlled oscillator;

an intermediate-frequency amplifier the input of which is supplied with the output signal of said mixer;

a detector the input of which is supplied with the output signal of said intermediate-frequency amplifier;

a digital circuit for generating a binary information which controls the frequency-dividing ratio of said programmable divider;

a memory which stores a plurality of binary informations generated from said digital circuit;

a read-out circuit which sequentially reads out whole binary informations already stored in said memory in response to a write-down command signal;

a digital comparator circuit coupled to said readout circuit and said digital circuit for comparing the whole binary informations already stored in said memory with a binary information generated from said digital circuit; and a write-down circuit which starts writing down said binary information from said digital circuit into said memory in response to an output signal of said digital comparator circuit when said whole binary informations already stored in said memory are not in agreement with said binary information generated from said digital circuit.

2. A synthesizer tuner according to claim 1, wherein said memory is an electrically alterable and nonvolatile memory.

* * * * *